United States Patent
Ichikawa

(10) Patent No.: US 8,093,787 B2
(45) Date of Patent: Jan. 10, 2012

(54) TUNING-FORK-TYPE PIEZOELECTRIC VIBRATING PIECE WITH ROOT PORTIONS HAVING TAPERED SURFACES IN THE THICKNESS DIRECTION

(75) Inventor: Ryoichi Ichikawa, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 193 days.

(21) Appl. No.: 12/574,649

(22) Filed: Oct. 6, 2009

(65) Prior Publication Data

US 2010/0084949 A1    Apr. 8, 2010

(30) Foreign Application Priority Data

Oct. 6, 2008    (JP) ................................. 2008-259376

(51) Int. Cl.
*H03H 9/19*    (2006.01)
(52) U.S. Cl. ........................................................ 310/370
(58) Field of Classification Search .................... 310/370
See application file for complete search history.

(56) References Cited

U.S. PATENT DOCUMENTS

| | | | | |
|---|---|---|---|---|
| 6,584,843 B2* | 7/2003 | Abe et al. | .................... | 73/504.16 |
| 7,015,631 B2* | 3/2006 | Hirasawa et al. | ............. | 310/370 |
| 7,368,861 B2* | 5/2008 | Tanaya | .......................... | 310/370 |
| 7,521,846 B2* | 4/2009 | Tanaya | .......................... | 310/370 |
| 7,523,537 B1* | 4/2009 | Knowles et al. | ................ | 29/594 |
| 7,550,905 B2* | 6/2009 | Tanaya | .......................... | 310/370 |
| 7,973,458 B2* | 7/2011 | Iwai | .............................. | 310/370 |
| 2010/0164332 A1* | 7/2010 | Kawanishi | .................... | 310/370 |
| 2011/0156831 A1* | 6/2011 | Tanaya et al. | ................. | 331/158 |

FOREIGN PATENT DOCUMENTS

| | | | | |
|---|---|---|---|---|
| JP | 55125714 | A | * | 9/1980 |
| JP | 55130218 | A | * | 10/1980 |
| JP | 56068012 | A | * | 6/1981 |
| JP | 56068020 | A | * | 6/1981 |
| JP | 57-026723 | | | 2/1982 |
| JP | 2003-133895 | | | 5/2003 |
| JP | 2004-072609 | | | 3/2004 |
| JP | 2005-012767 | | | 1/2005 |
| JP | 2007013910 | A | * | 1/2007 |
| JP | 2007-098824 | | | 4/2007 |
| JP | 2007-251762 | | | 9/2007 |
| JP | 2007-282192 | | | 10/2007 |
| JP | 2009165006 | A | * | 7/2009 |
| JP | 2009284073 | A | * | 12/2009 |

\* cited by examiner

*Primary Examiner* — Jaydi San Martin
(74) *Attorney, Agent, or Firm* — Klarquist Sparkman, LLP

(57) ABSTRACT

Tuning-fork-type crystal vibrating pieces are disclosed that have a base and a pair of vibrating arms extending from one side of the base in a designated longitudinal direction. A root portion is situated between the vibrating arms, and includes a first taper surface. Extending outboard of the vibrating arms from respective sides of the base are respective supporting arms that extend in the designated direction. Between each supporting arm and the respective vibrating arm is a respective supporting-arm root portion. Each supporting-arm root portion has a second taper surface in the thickness direction of the base.

2 Claims, 7 Drawing Sheets

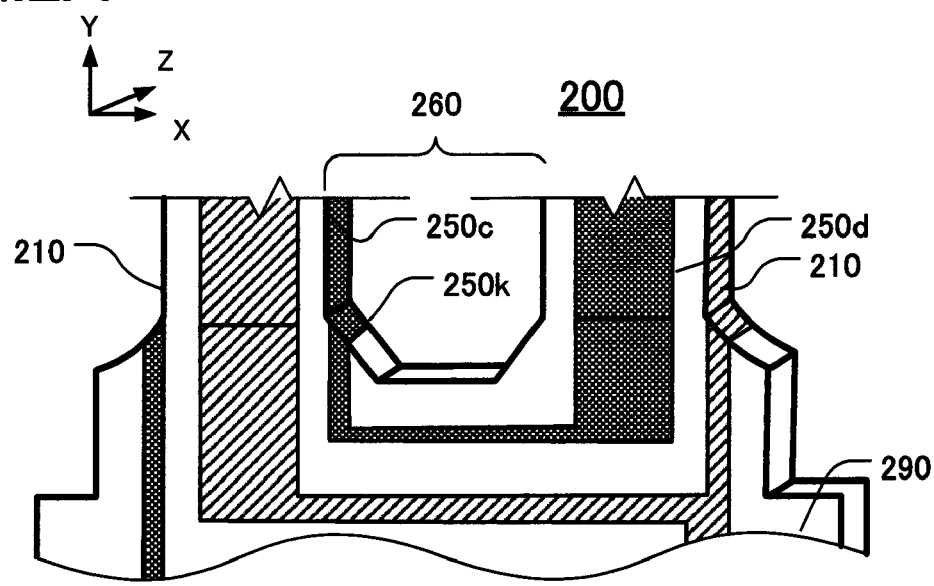
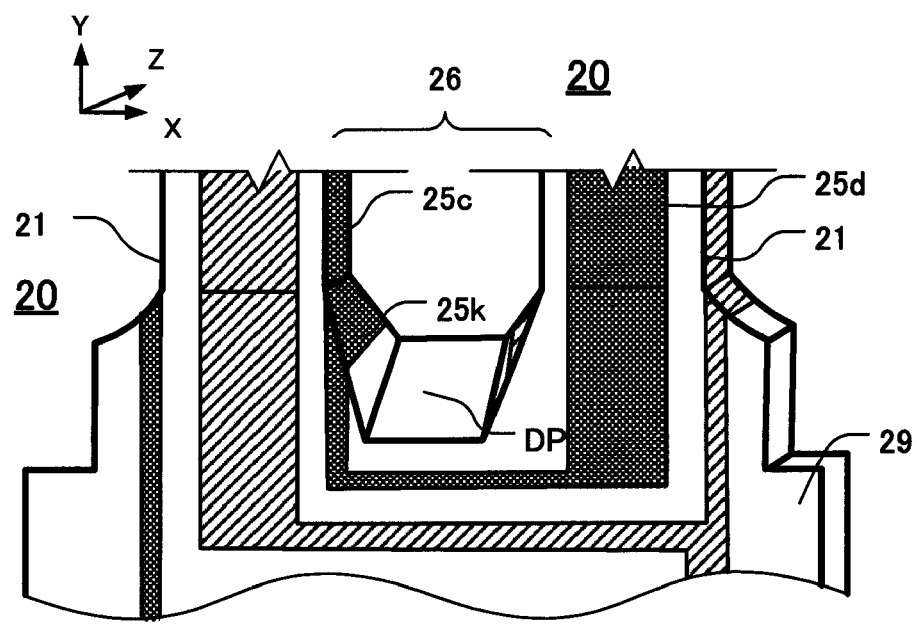

FIG.3
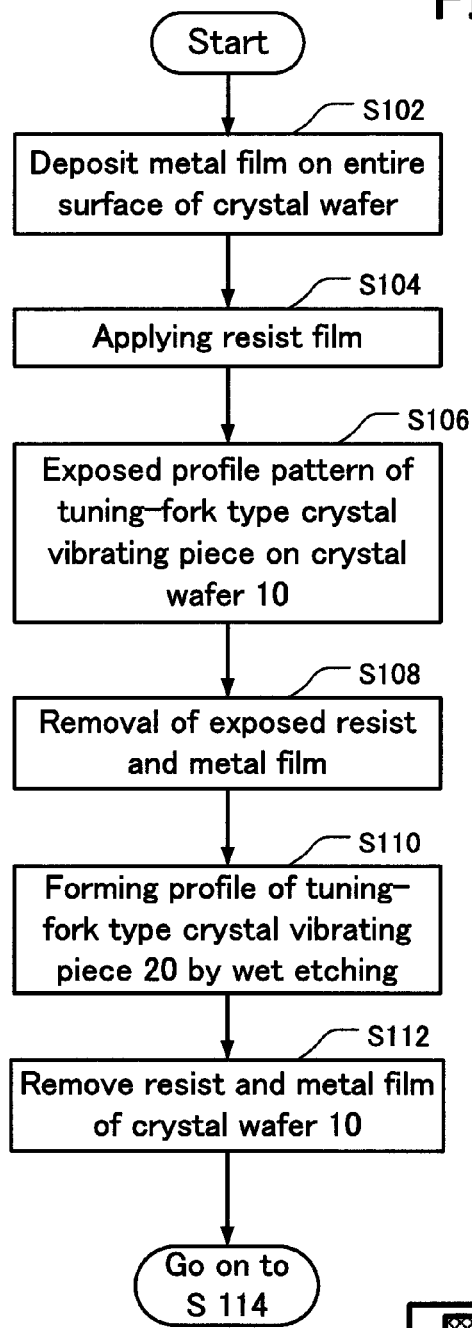
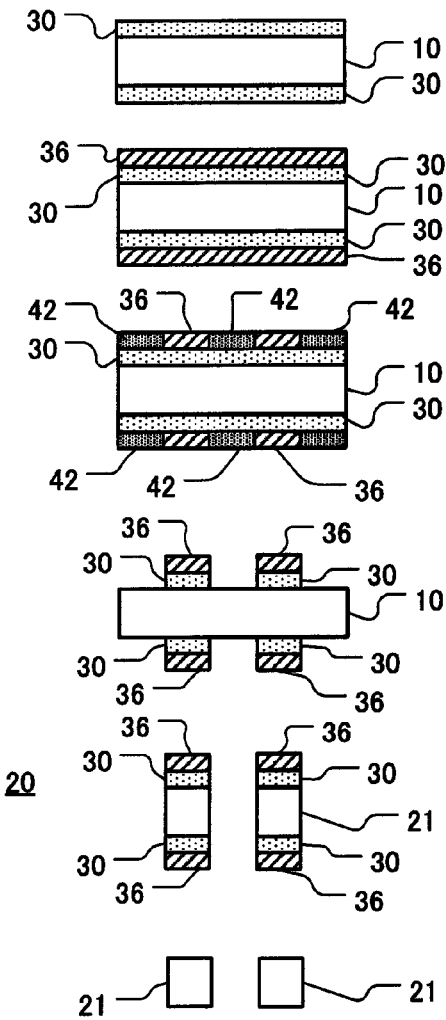
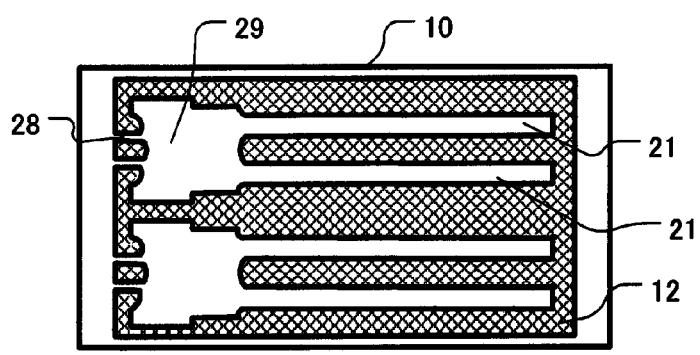

FIG.4
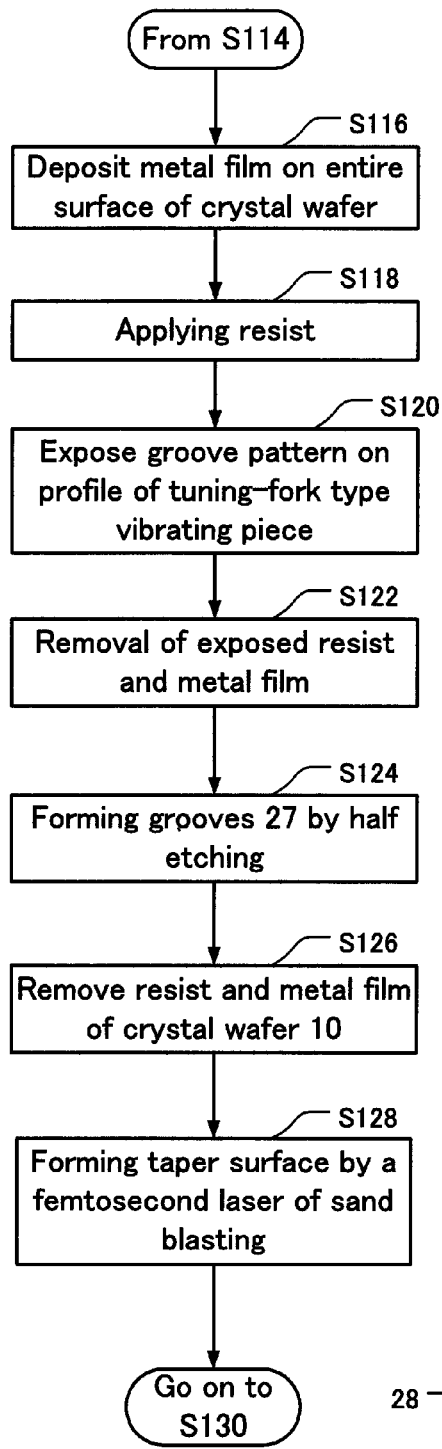
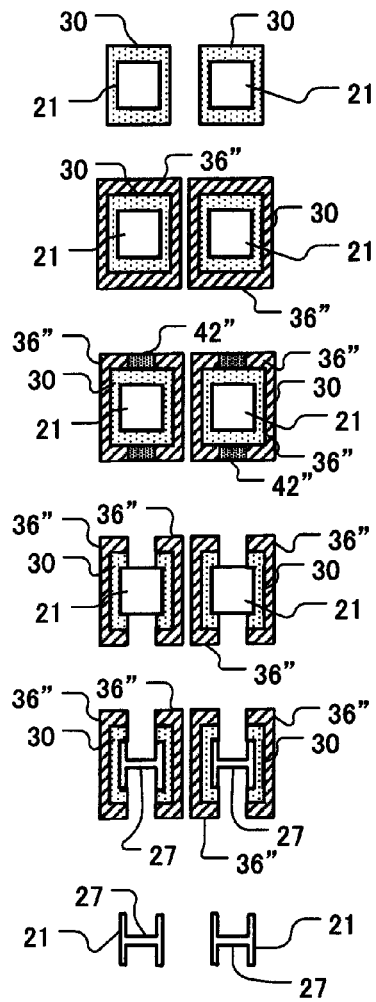
Steps of forming grooves and taper surface
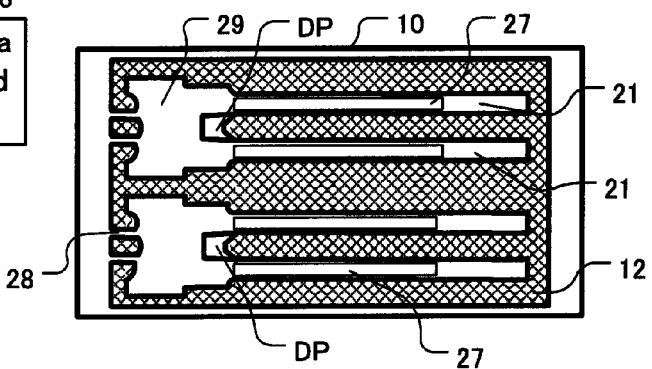

TUNING-FORK-TYPE PIEZOELECTRIC VIBRATING PIECE WITH ROOT PORTIONS HAVING TAPERED SURFACES IN THE THICKNESS DIRECTION

CROSS-REFERENCE TO RELATED APPLICATION

This application claims priority to and the benefit of Japan Patent Application No. 2008-259376, filed on Oct. 6, 2008, in the Japan Patent Office, the disclosure of which is incorporated herein by reference in its entirety.

FIELD

The present invention relates to tuning-fork-type piezoelectric vibrating pieces comprised of piezoelectric materials, and to methods for manufacturing same.

DESCRIPTION OF THE RELATED ART

Various types of clocks, home electric appliances, and consumer electronics, and various types of commercial/industrial electrical apparatus such as information/communication devices and Office-Automation (OA) devices utilize at least one oscillator. These oscillators typically are manufactured by packaging a piezoelectric resonator, a piezoelectric vibrating device, or an integrated circuit (IC) chip as a clock source for addition to and use by an electronic circuit of an apparatus In other apparatus, piezoelectric timing devices, such as real-time clock modules, are widely used. Piezoelectric vibrating devices must be increasingly miniaturized and/or provided with a thinner or lower profile so as to be correspondingly accommodated in electronic devices that likewise are miniaturized and/or provided with a lower profile.

As piezoelectric vibrating devices become smaller, etching solution used during manufacturing remains at the root portions of vibrating arms as corrosion residue. In addition, fabrication of crystals becomes difficult because of the effects of anisotropy. If electrodes are formed where the corrosion residue has remained, the electrode patterns short-circuit, and it may cause defective products and decreased accuracy of manufacturing dimensions. Note that anomalous etch zones are usually formed due to the effect of crystal anisotropy. The anomalous etch zones have substantial effect on the characteristics of a tuning-fork-type piezoelectric vibrating piece as it is miniaturized.

Therefore, U.S. Pat. No. 7,544,464 ("the '464 patent") provided manufacturing methods of piezoelectric vibrating pieces that prevent short-circuiting of electrode. The manufacturing method of the '464 patent explains that after metal electrode patterns are formed, laser light is irradiated to the root portion of vibrating arms as it removes a part of the central base portion the of root portion.

Japan Unexamined Patent Application No. 2007-173906 ("the '906 application") describes a manufacturing method for piezoelectric vibrating pieces to form thin electrode films precisely on tiny piezoelectric vibrating pieces. The manufacturing method in the '906 application includes, after forming an element piece of a piezoelectric vibrating piece by etching a piezoelectric board having anisotropy, forming the electrode film for driving the electrode at areas except anomalous etch zones due to anisotropy. The driving electrodes are formed by a photolithography method.

The '464 patent disclosed a method of preventing short-circuiting of the electrode pattern by using a laser beam to irradiate the root portion of vibrating arms. However, as feature sizes become smaller, fabrication becomes more difficult due to the effect of crystal anisotropy, which causes difficulty in forming electrodes and improving size accuracy of the electrode.

In the '906 application, a mask is applied at the anomalous etch zones caused by the effect of crystal anisotropy so as not to form an electrode film. After the electrode film is formed on the areas that are denuded from the mask, the mask is removed. Thus, a method of preventing short-circuiting of an electrode pattern is described. As the piezoelectric vibrating piece becomes smaller, fabrication is still difficult due to the effect of crystal anisotropy. Formation of electrodes and improving accuracy of dimension is also difficult.

Hence, a manufacturing method for piezoelectric vibrating pieces that prevents short-circuiting of electrode patterns caused by miniaturization and also forms high quality electrodes readily is needed.

The purpose of the technology described herein is to provide piezoelectric vibrating pieces manufactured by a method that prevents corrosion by leftover etching solution at root portions of vibrating arms, prevents short-circuiting of electrode patterns, and forms electrode patterns readily and accurately while manufacturing tuning-fork-type piezoelectric vibrating pieces.

SUMMARY

A tuning-fork-type piezoelectric vibrating piece of a first aspect is comprised of a base portion and a pair of vibrating arms that extend from one side of the base portion in a designated direction, wherein a root portion of the vibrating arms has a first taper surface in the thickness direction of the base portion.

As to the first aspect, by forming the first taper surface in a thickness direction of the base portion at a root portion of the vibrating arms, the corrosion residue at the root portion due to leftover etchant can be removed, thereby preventing short-circuiting caused by miniaturization. Note that anomalous etch zones due to the effect of crystal anisotropy are also removed.

Also, as the electrodes formed on the first taper surface are oriented at a certain angle with respect to an exposure direction, forming of electrodes becomes easier and fluctuation caused by applying resist, exposure, development and metal etching can be reduced. Thus, very precise electrodes can be formed. Adding this step improves the quality of electrodes and also can prevent short-circuits, thereby increasing fabrication yield.

The tuning-fork-type piezoelectric vibrating piece of a second aspect is comprised of a pair of supporting arms, which extend from one side of the base portion in the designated direction at the outer sides of the vibrating arms, and a root portion of supporting arms which is formed in-between one of the vibrating arms and one of the supporting arms having a second taper surface in the thickness direction of the base portion.

According to the second aspect, because the electrodes can be formed on the taper surface formed at the root portion of the supporting arms, short-circuiting caused by miniaturization can be prevented. Note that because the electrodes are formed on the taper surface, the forming of electrodes becomes easier and an electrode having high quality can be manufactured.

The tuning-fork-type piezoelectric vibrating piece of a third aspect has first or second taper surfaces that incline within a range of 20 to 85 degrees to the base portion in a longitudinal direction.

The tuning-fork-type piezoelectric vibrating piece of a fourth aspect has a root portion of the vibrating arms that has the same shape of a root portion of the supporting arms. Because of such configuration, etchant flows evenly between the vibrating arms and the supporting arms so that etching can be processed evenly. Thus, the crystal impedance (CI) value can be increased and oscillation leakage can be reduced.

A manufacturing method of a tuning-fork-type piezoelectric vibrating piece of a fifth aspect comprises steps of forming a profile of a base portion and at least a pair of vibrating arms by wet etching to form a first taper surface; and forming a metal electrode pattern after forming of the first taper surface, wherein the pair of vibrating arms extends from the base portion in a designated direction. The first taper surface is formed by a cutting process at a root portion of the vibrating arms along a thickness direction of the base portion.

During the manufacturing of the tuning-fork-type crystal vibrating piece, a first taper surface can be formed readily by a cutting process before forming electrodes. By forming such a first taper surface the corrosion residue is removed; therefore, a tuning-fork-type crystal vibrating piece which prevent short-circuiting caused by miniaturization can be manufactured easily. Because the first taper surface is formed, forming electrodes becomes easier and fluctuation caused by applying resists, exposure, development and metal etching can be reduced. Thus, very precise electrodes can be formed. This step improves electrode quality and can also prevent short-circuit, thereby improving fabrication yield.

The manufacturing method of a sixth aspect further comprises forming a pair of supporting arms; and forming a second taper surface, wherein the supporting arms extend from the base portion in a designated direction and are formed by wet etching at outer sides of the vibrating arms. The second taper surface is formed by a cutting process at the root portion of the vibrating arms along a thickness direction of the base portion.

According to the configuration of a sixth aspect, because the second taper surface can be formed at the root portion of the supporting arms, the electrodes are formed easily and also short-circuiting caused by miniaturization can be prevented. Note that because the electrodes are formed on the second taper surface, electrode formation becomes easier and a high-quality electrode can be manufactured.

The manufacturing method of a seventh aspect is that in the first and the second taper-forming steps, the cutting is processed at 45 degrees in the thickness direction. Therefore, the first and second taper surface can be formed by using energy efficiently.

The manufacturing method of an eighth aspect is that the piezoelectric vibrating piece is manufactured by etching a Z-cut crystal.

As explained above, the tuning-fork-type crystal vibrating piece of certain embodiments is comprised of a taper surface in a thickness direction, thus preventing the short-circuiting of electrodes caused by miniaturization. Because the taper surface is formed, exposure and forming of electrodes becomes easier and fluctuation caused by applying resists, exposure, development and metal etching can be reduced. Thus, very precise electrodes can be formed. These methods also improve electrode quality and can also prevent short-circuiting, thereby increasing fabrication yield.

BRIEF DESCRIPTION OF THE DRAWINGS

FIG. 2A is an enlarged view of a root portion 260 of conventional art.

FIG. 2B is an enlarged view of root portion 26 of an embodiment of the present invention.

FIG. 3 is a flow chart of profile-forming steps of a tuning-fork-type crystal vibrating piece 20 using a Z-cut crystal wafer.

FIG. 4 is a flow chart of forming steps of groove portion 27 at vibrating arms 21 of a tuning-fork-type crystal vibrating piece 20.

DETAILED DESCRIPTION

Embodiments of the present invention will be explained by referring to the following drawings, but it is not limited to those embodiments.

Configuration of a Tuning-Fork-Type Crystal Vibrating Piece

Figure 1A:
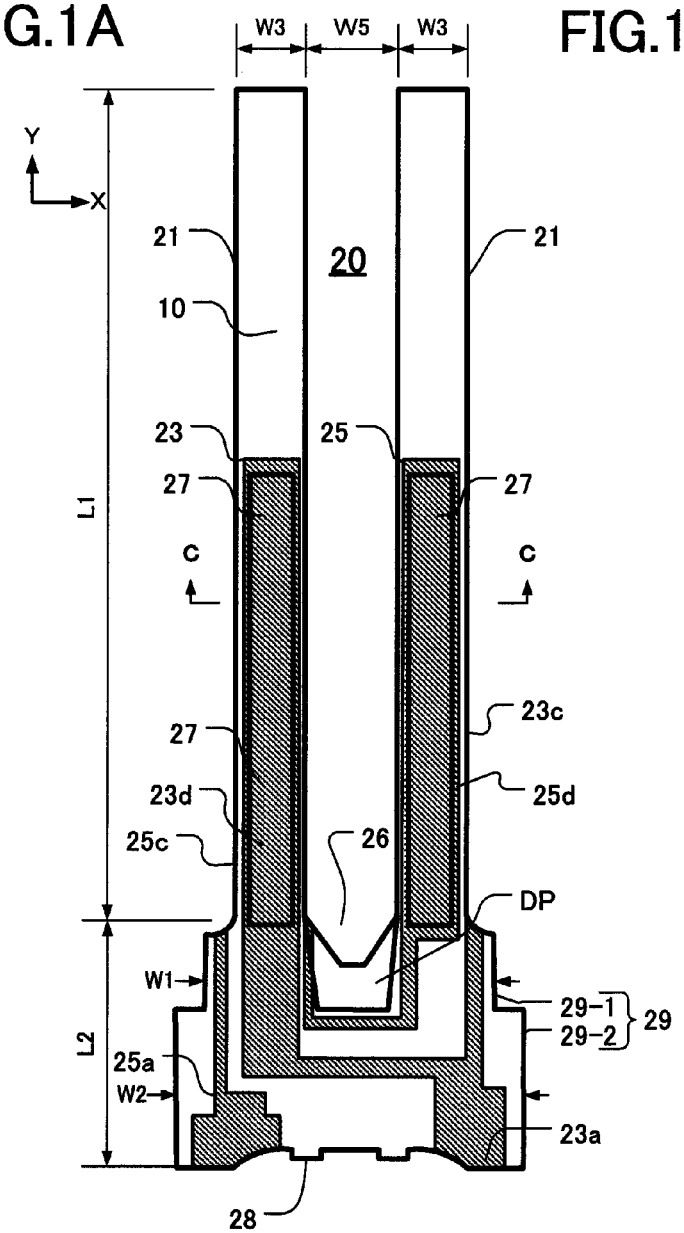
FIG. 1A is a plan view showing a configuration of tuning-fork-type crystal vibrating piece 20.
Figure 1B:
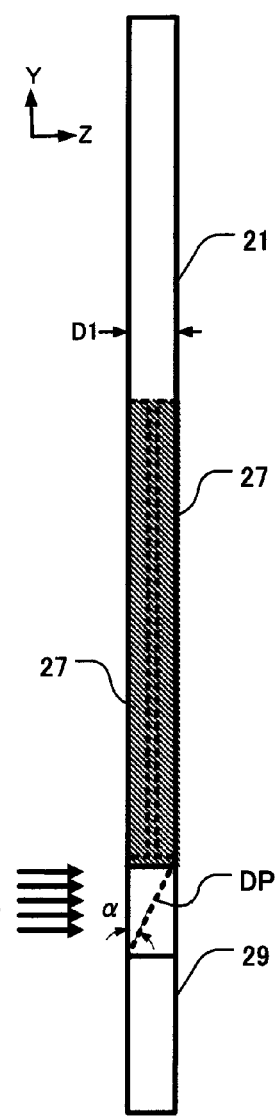
FIG. 1B is a side view of the tuning-fork-type crystal vibrating piece 20.
Figure 1C:
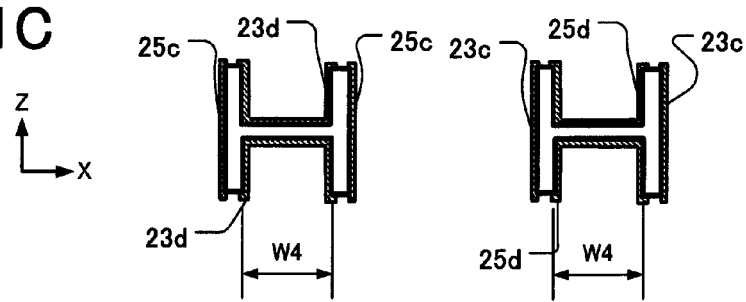
FIG. 1C is a cross-sectional view of a pair of vibrating arms 21 along the line C-C in FIG. 1A.

FIG. 1A is a plan view showing a configuration of a tuning-fork-type crystal vibrating piece 20. FIG. 1B is a side view of the tuning-fork-type crystal vibrating piece 20. FIG. 1C is a cross-sectional view of a pair of vibrating arms 21 along the line C-C in FIG. 1A. A base material of a tuning-fork-type crystal vibrating piece 20 is made of a Z-cut crystal wafer 10.

As shown in FIG. 1A, a tuning-fork-type crystal vibrating piece 20 is comprised of a base 29 comprising a first base portion 29-1 and a second base portion 29-2, and a pair of vibrating arms 21 which extends parallel in the Y-direction as a tuning-fork. In this embodiment, the tuning-fork-type piezoelectric vibrating piece comprises a pair of vibrating arms 21, but the vibrating piece can also be comprised of three, four or more vibrating arms.

The tuning-fork-type crystal vibrating piece 20 is a very small vibrating piece which oscillates at frequency of 32.768 kHz. In FIG. 1A, a length L1 of vibrating arms is about 1.20 mm to 1.50 mm, a length L2 of the base portion 29 is about 0.30 mm to 0.50 mm, and the entire length of first tuning-fork-type piezoelectric vibrating piece 20 is about 1.50 mm to 2.00 mm. A width W1 of the first base portion 29-1 is about 0.34 mm to 0.50 mm and a width W2 of the second base portion 29-2 is about 0.40 mm to 0.60 mm. A width W3 of vibrating arms 21 is about 0.08 mm to 0.12 mm. A distance W5 between the pair of vibrating arms 21 is about 0.08 mm to 0.12 mm. As FIG. 1B shows, a thickness D1 of the vibrating arms 21 and the base 29 is about 0.08 mm to 0.12 mm.

A respective groove 27 is formed on each of the upper and lower surfaces of each vibrating arm 21, yielding a total of four grooves 27 per pair of vibrating arms 21. The depth of the grooves 27 is normally 30 to 45 percent of the thickness of the vibrating aims 21. The width of the grooves 27 is normally 65 to 85 percent of the width W3 of vibrating arms 21. As shown in FIG. 1C, a cross-section of a vibrating arm 21 having grooves 27 on the upper and lower surfaces has a substantially H-shaped transverse profile. The H-shaped profile is effective in reducing the CI of the crystal vibrating piece 100.

The base 29 of the tuning-fork-type crystal vibrating piece 20 has substantially a "board" shape. Because the widths W1 and W2 are different, even if oscillation in the Y-direction occurs as the vibrating arms 21 oscillate, oscillation leakage transmitted from the vibrating arms 21 to the second base portion 29-2 can be reduced. On the base 29, two connecting portions 28 are formed. The connecting portions 28 are connected to a crystal wafer 10 as the tuning-fork profile is being etched by photolithography or wet etching.

On the vibrating arms 21 and the base 29 of the tuning-fork-type crystal vibrating piece 20, a first electrode pattern 23 and a second electrode pattern 25 are formed. Those electrodes have a two-layer structure in which an Au layer of 400 to 2000 Ångstroms is formed on a sub-layer of Ni that is 150 to 700 Ångstroms thick. Titanium (Ti) instead of nickel (Ni) and silver (Ag) instead of gold (Au) can be used.

On the base 29, as shown in FIG. 1A, a first base electrode 23a and a second base electrode 25a are formed, and on the grooves 27 of vibrating arms 21, a first groove electrode 23d and a second groove electrode 25d are formed, respectively. Also, as shown in FIG. 1C, respective second side-surface electrodes 25c are formed on both side surfaces of the left vibrating arm 21, and respective first side-surface electrodes 23c are formed on the right vibrating arm 21.

As FIG. 1B shows, by cutting the root portion 26 of the pair of vibrating arms 21 in the Z-direction, which is a thickness direction, a taper surface DP is formed. The configuration and effect of the taper surface DP will be described below.

FIG. 2A and FIG. 2B are enlarged views of the root portion 26 of the tuning-fork-type crystal vibrating piece 20 comprising conventional art and the disclosed technology. FIG. 2A is an enlarged view of the root portion 26 of conventional art, and FIG. 2B is of an embodiment of the present invention.

As shown in FIG. 2A, a tuning-fork-type crystal vibrating piece 200 of conventional art is comprised of a pair of vibrating arms 210 and a base 290. An electrode 250c is formed on a side surface of one of vibrating arms 210 and an electrode 25c is formed on a groove of another vibrating arm 21. The electrodes 250c and 250d are electrically connected by a connecting electrode 250k. However, due to the miniaturization of crystal vibrating pieces, the space occupied by the root portion 260 becomes smaller and etching solution is not easily spread in the space. This causes corrosion residue, and if electrodes are formed on the corrosion, it causes short-circuiting. Note that anomalous etch zones are usually formed due to the effect of crystal anisotropy.

However, in this embodiment, by forming a taper surface DP by cutting with a femtosecond laser system or by sandblasting, the corrosion residues as well as anomalous etch zones are removed and the problem is solved.

As shown in FIG. 2B, the taper surface DP is formed by cutting with a femtosecond laser system or sandblasting at the root portion 26 in the Z-direction of the tuning-fork-type crystal vibrating piece 20. Note that the connecting electrode 25k connecting the electrode 25c and 25d is formed on the taper surface DP.

Therefore, forming the connecting electrode 25k by irradiating light along the Z-direction and exposing, as shown in FIG. 1B, the taper surface DP on which the connecting electrode 25k is formed has a certain angle to the Z-direction so that the exposure forming the connecting electrode 25k can be performed. The electrodes can be formed easily and accurately compared to the conventional art (FIG. 2A), which forms the electrode on a surface parallel to the irradiated light.

Note that in the Z-direction, angle α of the taper surface DP relative to the base 29 in the longitudinal direction is preferably 20 to 85 degrees. By configuring such an angle, the electrodes can be formed easily and accurately.

Methods for Manufacturing Tuning-Fork-Type Crystal Vibrating Piece

Manufacturing methods for making tuning-fork-type crystal vibrating pieces 20 are explained below. FIG. 3 is a flow chart showing steps for profile formation of the tuning-fork-type crystal vibrating piece 20 using a Z-cut crystal wafer. Cross-sectional views or top views are shown on the right of the flow chart.

In step S102, a corrosion-resistant metal film is applied by, for example, sputtering or vacuum deposition, to the entire surface of the Z-cut crystal wafer 10. However, whenever a Z-cut crystal wafer 10 is used as a piezoelectric material, it is difficult to deposit gold (Au) or silver (Ag) directly on the wafer surface. Hence, a layer of nickel (Ni) or titanium (Ti) is first applied as a base coat. A cross-sectional view of the Z-cut of a crystal wafer 10 upon completion of step 102 is shown on the right of step S102.

In step S104, a photoresist film 36 is applied evenly, for example, by spin coating, on the crystal wafer 10 on which the layer of nickel and of gold are formed. As a photoresist film 36, for example, positive photoresist of novolak resin or negative photoresist can be used. The cross-sectional view of Z-cut crystal wafer 10 upon completion of step 104 is shown on the right of step S104.

In step S106, a pattern profile of photo-mask is exposed using an exposure device (not shown) on the crystal wafer 10 to which the photoresist film 36 has been applied. In order to wet-etch both sides of crystal wafer 10, both sides of the crystal wafer 10 are exposed. The resulting pattern of exposed photoresist 42 and unexposed photoresist 36 is shown to the right of step S106.

In step S108, the pattern-exposed photoresist layer 36 is developed, and then the exposed photoresist 42 is removed. Portions of the gold layer now revealed by removal of the exposed photoresist 36 are etched using an aqueous solution of iodine and potassium iodide. Then, portions of the underlying nickel layer revealed by removing corresponding portions of the gold layer are etched using, for example, an aqueous solution of ceric di-ammonium nitrate and acetic acid. The concentrations of these etchants, etching temperature, and etching time are controlled to avoid over-etch. Completion of etching results in complete removal of the metal layer 30 from the revealed locations. As shown to the right of step S108, a structure is thus formed in which the single-crystal wafer 10 now defines the profile outline of the tuning-fork-type crystal vibrating piece 20.

In step S110, portions of crystal wafer 10 revealed by removal of the photoresist film 36, and metal film 30 is etched by using hydrofluoric acid as etchant so as to form a profile outline of the tuning-fork-type crystal vibrating piece 20. The resulting cross-sectional view of vibrating arms 20 which are coated by the metal film 30 or photoresist film 36 is shown on the right of step S110. As the drawing at the bottom shows, void regions 12 (shaded regions) are formed.

In step S112, by removing unneeded photoresist film 36 and metal film 30, a tuning-fork-type crystal vibrating piece 20, depicted at the bottom of the flow chart, is formed. However, the crystal wafer 10 and the tuning-fork-type crystal vibrating piece 20 are connected by connecting portions 28, and the piece 20 is not yet removed from the wafer. The cross-sectional view of vibrating arms 21 upon completion of step 112 is shown on the right of step S112.

The drawing at the bottom of the flow chart in FIG. 3 is an enlarged plan view of a tuning-fork-type crystal vibrating piece 20 as formed on the crystal wafer 10. The piece 20 is formed with a designated size by etching the void region 12 on the crystal wafer. The connecting portions 28 are formed on the base 29. The connecting portions 28 connect the crystal wafer 10 and the tuning-fork-type crystal vibrating piece 20 so that a plurality of pieces 20 can be formed in one crystal wafer 10 and handled simultaneously.

FIG. 4 is a flow chart showing steps of forming grooves 27 on the vibrating arms 21. Cross-sectional views and a partial top view of the vibrating arms 21 are depicted on the right of the flow chart.

In step S116, the tuning-fork-type crystal vibrating piece 20 is washed by purified water, and then a metal film 30 is formed on entire surface of the piece 20 to form grooves 27. The cross-sectional view of vibrating arms 21 upon completion of step S116 is shown on the right of step S116.

In step S118, the photoresist film 36" is applied on the entire surface by spraying. Because the profiles of tuning-fork-type crystal vibrating piece 20 are already formed, the photoresist film 36" is also applied on side surfaces by spraying. The cross-sectional view of vibrating arms 21 upon completion of step S118 is shown on the right of step S118.

In step S120, a photo mask for the groove corresponding to the groove 27 is prepared and then a groove pattern is exposed on the crystal wafer 10 on which the photoresist film 36" is applied. The grooves 27 are formed on both upper and lower surfaces of each vibrating arm 21. In step S120 the surfaces of tuning-fork-type crystal vibrating piece 20 are exposed by using i-line exposure light having a 365 nm wavelength. A cross-sectional view of vibrating arms 21 having exposed photoresist film 42" is shown on the right of step S120.

In step S122, after exposing the photoresist film 36", the exposed photoresist film 42" is removed, and then a gold layer revealed by the removal is etched. Next, the nickel layer revealed by the removal of the gold layer is etched. The concentrations of these etchants, etching temperature, and etching time are controlled to avoid over-etch. Completion of etching results in complete removal of the metal layer 30 from the revealed locations. As shown to the right of step S122, the structure of the vibrating arms 21 of tuning-fork-type crystal vibrating piece 20 is thus formed.

In step S124, etching to form the grooves 27 is performed. Crystal material revealed from the photoresist 36" corresponding to the grooves 27 is wet etched so as to form profiles of the grooves 27. As shown to the right of step S124, etching is carefully controlled to prevent etching completely through the crystal material in the grooves 27 (such over-etching would cause the grooves to become through-holes).

Next, in step S126, remaining portions of the photoresist layer 36" and metal film 30 on the tuning-fork-type crystal vibrating device 20 are removed to complete formation of the grooves 27 on the arms 21. The structure resulting from this step is shown to the right of step S126. The tuning-fork-type crystal vibrating piece 20 obtained through those steps still has corrosion residue at the root portion 26. Anomalous etch zones due to crystal anisotropy may also remain.

In step S128, the taper surface DP is formed at the root portion 26 of the tuning-fork-type crystal vibrating piece 20. By forming the taper surface DP, the corrosion residue and anomalous etch zones can be removed.

The taper surface DP is cut at an angle of 20 to 85 degrees relative to the base in the longitudinal direction and at 45 degrees relative to the thickness direction of wafer 10 by using a femtosecond laser or by sandblasting. Thus, energy can be used efficiently. The enlarged view of the crystal wafer 10 having the taper surface DP at root portion 20 is shown to the right of step S128.

That is, using the femtosecond laser, by cutting the surface of the root portion 26 at 45 degrees in the thickness direction, the taper surface DP can be formed readily.

Figure 5:
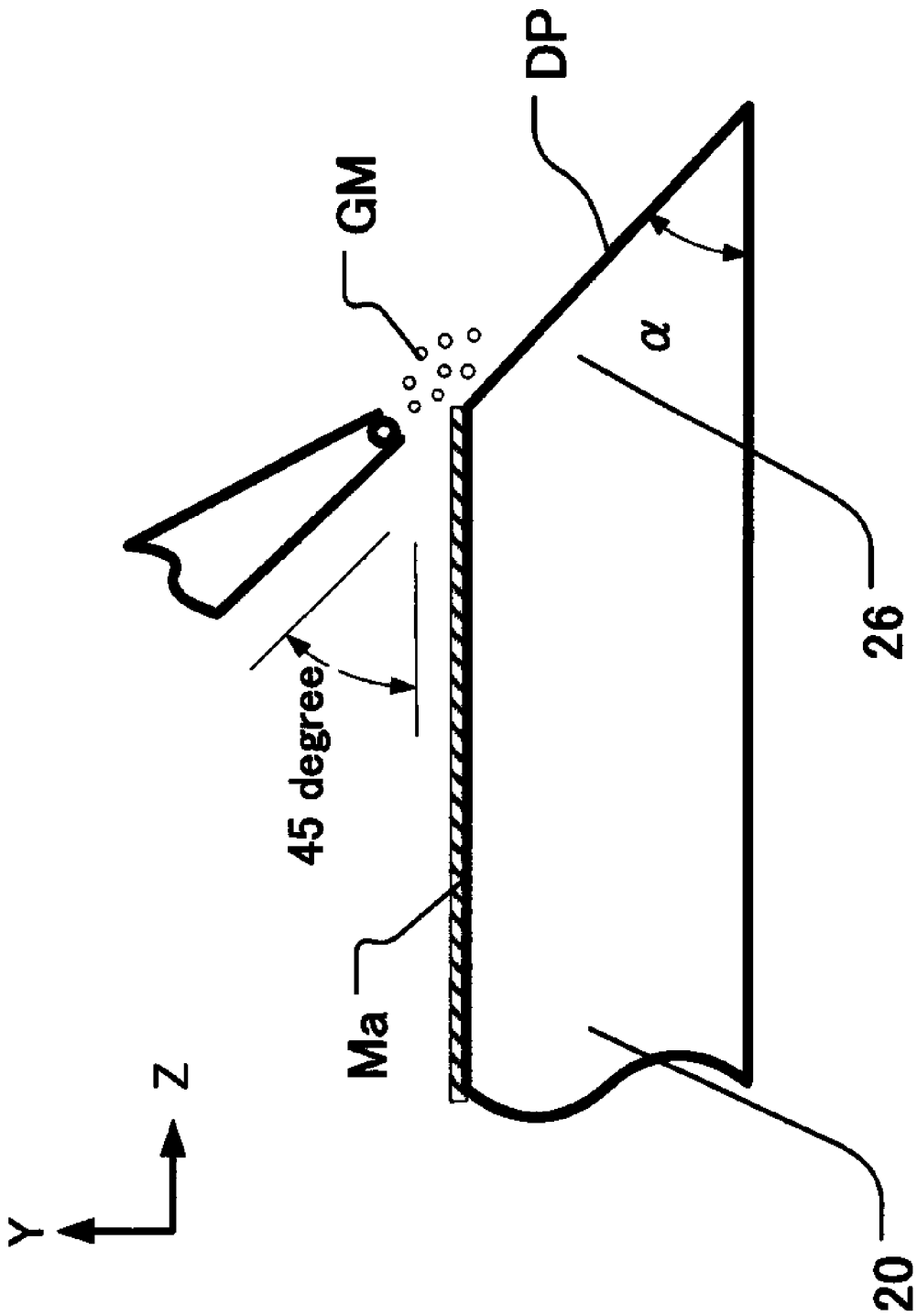
FIG. 5 is a simulated drawing forming a taper surface DP at a root portion 26 of a tuning-fork-type crystal vibrating piece 20 by sandblasting.

As shown in FIG. 5, when the taper surface DP is cut by sand blasting, an abrasive agent GM (a mixture of air and sand) is sprayed on the surface of root portion 26 at an angle of 45 degrees in the Z-direction where the mask Ma covers the tuning-fork-type crystal vibrating piece 20. Thus, the taper surface DP is formed.

Figure 6:
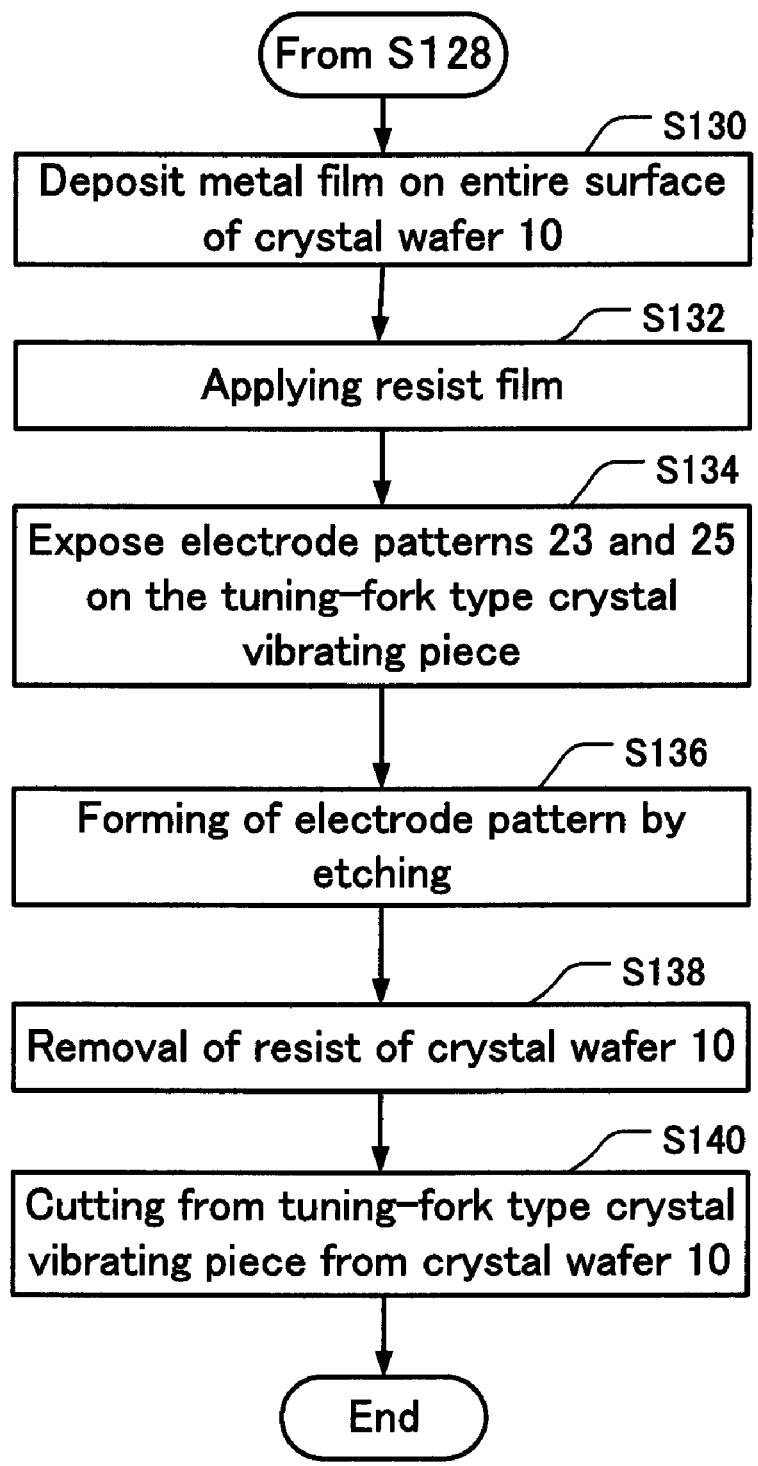
FIG. 6 is a flow chart showing steps of forming of electrode patterns on a tuning-fork-type crystal vibrating piece 20.

FIG. 6 is a flow chart of a process for forming electrode patterns.

In step S130, the tuning-fork-type crystal vibrating piece 20 is washed with purified water, and the first metal layer is formed by vacuum-deposition or sputtering to form a driving electrode for the device 20.

In step S132, a photoresist is applied over the piece 20 by spraying or similar technique.

In step S134, a photomask of the electrode pattern is prepared and used for lithographic exposure of the electrode patterns onto the crystal wafer 10. The electrode pattern is exposed on both sides (upper and lower) of the tuning-fork-type crystal vibrating piece 20.

In step S136, the photoresist layer is developed and the exposed photoresist is removed. The remaining photoresist corresponds to the electrode patterns and serves as an etching mask. Wet-etching of the metal film destined to become electrodes is performed. That is, portions of the gold layer revealed by removing the exposed photoresist and corresponding to the electrode pattern are etched by, for example, an aqueous solution of iodine and potassium iodide. Next, the portions of nickel layer are etched by, for example, an aqueous solution of ceric di-ammonium nitrate and acetic acid.

In step S138, the photoresist film is removed. After those steps, electrodes 23 and 25 are formed on the tuning-fork-type crystal vibrating piece 20 at an accurate position and with accurate widths.

In step S140, the tuning-fork-type crystal vibrating piece 20 is cut at the connecting portions 28 and removed from the crystal wafer 10.

Figure 7A:
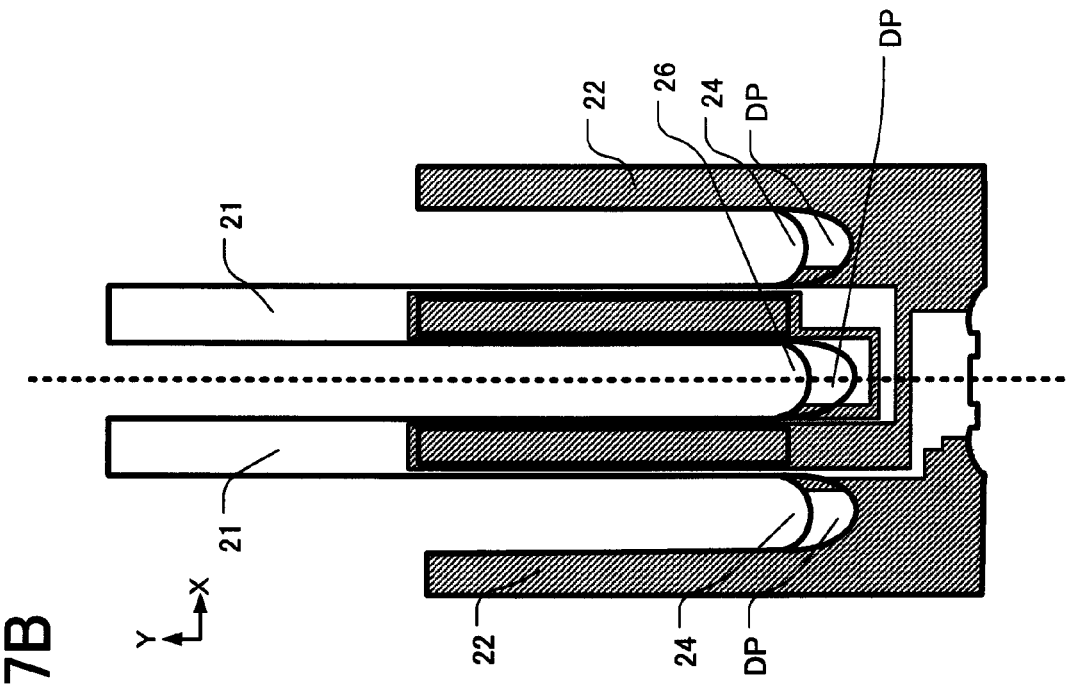
FIG. 7A is a first alternative example of a tuning-fork-type crystal vibrating piece 20.
Figure 7B:
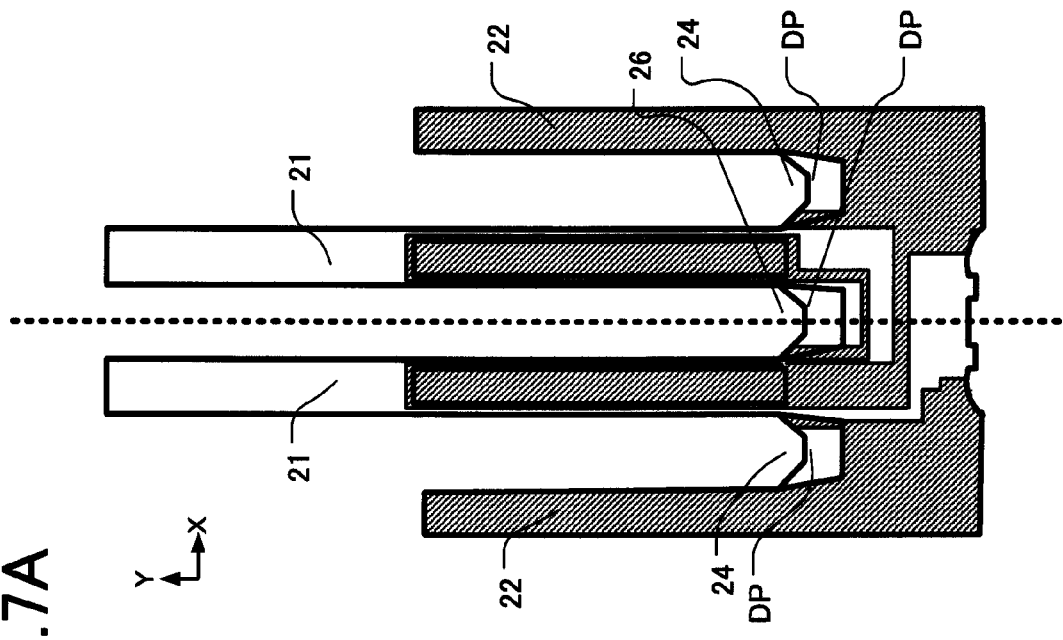
FIG. 7B is a second alternative example of a tuning-fork-type crystal vibrating piece 20.

FIG. 7A is a first alternative example of tuning-fork-type crystal vibrating piece 20, and FIG. 7B is a second alternative example of tuning-fork-type crystal vibrating piece 20. As shown in FIGS. 7A and 7B, the tuning-fork-type crystal vibrating piece 20 has respective supporting arms 22 extending outboard of the vibrating arms 21 from respective sides of the base 29 in the designated direction.

Note that respective supporting-arm root portions 24 are formed between each vibrating arm 21 and its respective supporting arm 22. The root portions 24 have tapered surfaces DP in the thickness direction of the supporting arms 22, similar to the root portion 26. Also, the supporting-arm root portions 24 and the root portion 26 have substantially similar shape and size. That is, the tuning-fork-type crystal vibrating piece 20 is formed symmetrically with its center line. Thus, balanced etching can be conducted.

In that case, the profile of supporting arms and electrodes formed thereon can be formed in the same way of forming the profile of vibrating arms and electrodes thereon. Note that the taper surface DP at the root portion 24 can be formed in the same way of forming the taper surface DP of the root portion 26. Thus, further explanation of forming these is omitted.

As is shown in FIG. 7B, the second alternative example of vibrating piece has a round "U-shape" root portion that differs from square-shape root portion. The taper surface DP is formed at the U-shape root portion.

By sealing the tuning-fork-type crystal vibrating piece formed in this matter within a box-shape package containing space inside, a tuning-fork-type piezoelectric vibrator can be formed. As to the package, for example, a plurality of ceramic green sheets comprised of oxidized aluminum can be layered and then sintered.

In the above-mentioned embodiments including a tuning-fork-type crystal vibrating piece, include, but are not limited to, using a lithium niobate or other piezoelectric single crystal material.

What is claimed is:

1. A tuning-fork-type piezoelectric vibrating piece, comprising:
   a base having a thickness direction;
   a pair of vibrating arms that extend from one side of the base in a designated longitudinal direction;
   a respective supporting arm extending outboard of each vibrating arm from a respective side of the base in the designated direction;
   a root portion situated between the vibrating arms, the root portion having a first taper surface in the thickness direction of the base; and
   a respective supporting-arm root portion situated between each vibrating arm and respective supporting arm, each supporting-arm root portion having a second taper surface in the thickness direction of the base;
   wherein the root portion of the vibrating arms has a substantially similar shape as the supporting-arm root portions.

2. The tuning-fork-type piezoelectric vibrating piece of claim 1, wherein the first and second taper surfaces incline independently within a range of 20 to 85 degrees relative to the base in the longitudinal direction.

* * * * *